US009455122B2

(12) United States Patent
Van De Peut et al.

(10) Patent No.: US 9,455,122 B2
(45) Date of Patent: Sep. 27, 2016

(54) MODULATION DEVICE AND POWER SUPPLY ARRANGEMENT

(71) Applicant: MAPPER LITHOGRAPHY IP B.V., Delft (NL)

(72) Inventors: Teunis Van De Peut, Leusden (NL); Hendrik Den Boer, S-Gravenzande (NL)

(73) Assignee: MAPPER LITHOGRAPHY IP B.V., Delft (NL)

(*) Notice: Subject to any disclaimer, the term of this patent is extended or adjusted under 35 U.S.C. 154(b) by 0 days.

(21) Appl. No.: 14/400,561

(22) PCT Filed: May 8, 2013

(86) PCT No.: PCT/EP2013/059604
§ 371 (c)(1),
(2) Date: Nov. 12, 2014

(87) PCT Pub. No.: WO2013/171117
PCT Pub. Date: Nov. 21, 2013

(65) Prior Publication Data
US 2015/0136994 A1 May 21, 2015

Related U.S. Application Data

(60) Provisional application No. 61/646,835, filed on May 14, 2012, provisional application No. 61/737,188, filed on Dec. 14, 2012.

(51) Int. Cl.
H01J 37/317 (2006.01)
H01J 37/04 (2006.01)
(Continued)

(52) U.S. Cl.
CPC ............ *H01J 37/3174* (2013.01); *B82Y 10/00* (2013.01); *B82Y 40/00* (2013.01); *H01J 37/045* (2013.01);
(Continued)

(58) Field of Classification Search
USPC .......................... 250/396 R, 492.22
See application file for complete search history.

(56) References Cited

U.S. PATENT DOCUMENTS 3,612,743 A 10/1971 Angele et al.
6,563,124 B2 5/2003 Veneklasen et al.
(Continued)

FOREIGN PATENT DOCUMENTS

CN 102067272 A 5/2011
CN 201937061 U 8/2011
(Continued)

OTHER PUBLICATIONS

Stibgen M., "Applying laminated busbars to enhance DC power distribution systems", INTELEC 26th Annual Conference, Sep. 19-23, 2004, Conference proceedings )IEEE), pp. 537-541.

*Primary Examiner* — Kiet T Nguyen
(74) *Attorney, Agent, or Firm* — Hoyng Rock Monegier LLP; David P. Owen

(57) ABSTRACT

The invention relates to a modulation device for modulating charged particle beamlets in accordance with pattern data in a multi-beamlet charged particle lithography system. The device comprises a plate-like body, an array of beamlet deflectors, a plurality of power supply terminals (202-205) for supplying at least two different voltages, a plurality of control circuits, and a conductive slab (201) for supplying electrical power to one or more of the power supply terminals (202-205). The plate-like body is divided into an elongated beam area (51) and an elongated non-beam area (52) positioned with their long edges adjacent to each other. The beamlet deflectors are located in the beam area. The control circuits are located in non-beam area. The conductive slab is connected to the control circuits in the non-beam area. The conductive slab comprises a plurality of thin conductive plates (202-205).

20 Claims, 10 Drawing Sheets

(51) Int. Cl.
  *B82Y 10/00* (2011.01)
  *B82Y 40/00* (2011.01)
  *H01J 37/30* (2006.01)

(52) U.S. Cl.
  CPC ........ *H01J 37/3007* (2013.01); *H01J 37/3177* (2013.01); *H01J 2237/0264* (2013.01); *H01J 2237/0437* (2013.01); *H01J 2237/2485* (2013.01); *H01J 2237/31754* (2013.01); *H01J 2237/31774* (2013.01)

(56)     References Cited

U.S. PATENT DOCUMENTS

| | | |
|---|---|---|
| 6,897,458 B2 | 5/2005 | Wieland et al. |
| 6,958,804 B2 | 10/2005 | Wieland et al. |
| 7,019,908 B2 | 3/2006 | van 't Spijker et al. |
| 7,084,414 B2 | 8/2006 | Wieland et al. |
| 7,129,502 B2 | 10/2006 | Kruit |
| 8,089,056 B2 | 1/2012 | Wieland et al. |
| 8,604,411 B2 * | 12/2013 | Wieland ............... B82Y 10/00 250/216 |
| 2002/0134912 A1 | 9/2002 | Veneklasen et al. |
| 2007/0064213 A1 | 3/2007 | Jager et al. |
| 2009/0261267 A1 | 10/2009 | Wieland et al. |
| 2011/0079730 A1 | 4/2011 | Wieland |
| 2012/0091318 A1 | 4/2012 | Wieland |
| 2012/0091358 A1 | 4/2012 | Wieland et al. |
| 2012/0115306 A1 * | 5/2012 | Yamazaki ............... B82Y 10/00 438/460 |
| 2015/0090896 A1 * | 4/2015 | Tsuchiya ............... H01J 37/045 250/397 |

FOREIGN PATENT DOCUMENTS

| | | |
|---|---|---|
| EP | 0613169 A1 | 8/1994 |
| EP | 0805571 A2 | 11/1997 |
| JP | 2001112147 A | 4/2001 |
| JP | 2007 287544 A | 11/2007 |
| JP | 2011-258842 A | 12/2011 |
| WO | WO 2009 127658 A1 | 10/2009 |
| WO | WO 2011/051301 A1 | 5/2011 |
| WO | WO 2011 051305 A1 | 5/2011 |
| WO | WO 2012/055938 A1 | 5/2012 |
| WO | WO 2012/062934 A1 | 5/2012 |
| WO | WO 2012055936 A1 | 5/2012 |

* cited by examiner

MODULATION DEVICE AND POWER SUPPLY ARRANGEMENT

FIELD OF THE INVENTION

The invention relates generally to lithography systems, and more particularly, to a charged particle beamlet modulation device and a power supply system for a beamlet modulation device.

BACKGROUND OF THE INVENTION

Charged particle lithography systems are known in the art, for example from U.S. Pat. No. 6,958,804 in the name of the applicant. This lithography system uses a plurality of electron beamlets to transfer a pattern to the target surface. The pattern data is sent to a modulation device, also referred to as a beamlet blanker array. Herein, the beamlets are modulated, for example by electrostatic deflection of the beamlets to switch selected beamlets on or off. The modulated beamlets are projected onto the surface of a target to be exposed. To enable high speed transfer of the pattern to the target surface, optical transmission of control signals to the modulation device may be used.

To manufacture lithography systems able to perform exposures having smaller critical pattern dimensions with sufficiently high throughput, charged particle systems have been proposed having a very large number of charged particle beamlets. The number of beams in a charged particle system suitable for smaller critical dimensions may be in the order of tens or hundreds of thousands or millions.

For lithography purposes the area in which final projection occurs is typically limited to a single field, and in a charged particle system where the beamlets remain substantially parallel this results in the area of the modulation device being limited to about 27×27 mm. The electrical power requirements of the modulation device are substantial, and the electrical current flowing in the modulation device will generate magnetic fields. In such a small area, the effect of these magnetic fields becomes significant. Any magnetic fields in the area of the modulation device will exert a deflecting force on the electron beamlets passing through the device, and even very small deflections of the beamlets may result in writing errors on the target.

SUMMARY OF THE INVENTION

It is therefore an object of the invention to reduce the effect of unwanted magnetic fields due to electrical currents flowing in a beamlet modulation device. The invention is defined by the independent claims. The dependent claims defined advantageous embodiments. Accordingly, the invention relates to a modulation device and to a charged particle lithography system, and to a power supply arrangement, according to the appended claims.

In a first aspect the invention relates to modulation device for use in a charged particle lithography system (100) adapted to generate charged particle beamlets (123). The modulation device is arranged for modulating the charged particle beamlets in accordance with pattern data and comprises: i) a plate-like body (106); ii) an array of beamlet deflectors (30) arranged on the plate-like body (106) for deflecting the beamlets; iii) a plurality of power supply terminals (202-205) for supplying at least two different voltages; iv) a plurality of control circuits (40, 41) arranged on the plate-like body (106) to receive the pattern data and supply corresponding control signals to the beamlet deflectors (30), wherein the control circuits (40, 41) are fed by the plurality of power supply terminals (202-205); and v) a conductive slab (201) arranged to supply electrical power to the power supply terminals (202-205). Furthermore, the body of the modulation device is divided into an elongated beam area (51) and an elongated non-beam area (52) positioned adjacent to the beam area (51) so that a long edge of the beam area (51) borders a long edge of an adjacent non-beam area (52). The beamlet deflectors are arranged in the beam area (51). The control circuits (40, 41) are located in the non-beam area (52) for providing control signals to the beamlet deflectors (30). The conductive slab (201) is connected to the control circuits (40, 41) in the non-beam area (52), the conductive slab (201) comprising a plurality of thin conductive plates (202-205), wherein the conductive slabs (201) forms part of the power supply arrangement. The beamlet deflectors and the control circuit arranged 'on' the plate-like body does not mean that they need to be exactly arranged only on the surface of the plate-like body. A portion of, or the whole of, the deflector and the control circuit may also be arranged in the plate-like body.

The power supply arrangement provides relatively a short power supply line to the control circuits and beamlet deflectors. A conductive slab (or conducting slab) comprising a plurality of thin conductive (or conducting) plates (preferably but not necessarily each plate connecting to a different power supply terminal) may be connected to the control circuits of the modulation device along all or a majority of the length of the slab, so that the conductive lines connecting the power supply to the control circuits and beamlet deflectors run in a direction substantially perpendicular to the face of the conductive slabs to minimize their length. Consequently, the magnetic field created by these interconnection lines can be minimized. A reduction in magnetic fields is achieved by a specific configuration of the conductive slab, which is composed by a number of thin conductive plates arranged in parallel.

An embodiment of the modulation device comprises a plurality of conductive slabs arranged to supply electrical power to the power supply terminals. The body of the modulation device is divided into a plurality of elongated beam areas and a plurality of elongated non-beam areas positioned adjacent to the beam areas so that a long edge of each beam area borders a long edge of an adjacent non-beam area. The beamlet deflectors are arranged in groups, each group of beamlet deflectors located in one of the beam areas. The control circuits are located in the non-beam areas for providing control signals to the beamlet deflectors. Each control circuit is located in one of the non-beam areas adjacent to one of the beam areas containing one or more of the beamlet deflectors receiving control signals from the control circuit. Furthermore, the conductive slabs are connected to the control circuits in the non-beam areas, each conductive slab comprising a plurality of thin conductive plates, wherein the plurality of conductive slabs forms part of the power supply arrangement. The advantage of this alternating modulation device design is that that the modulation device can be made larger (i.e. increasing the writing capacity of the charged particle lithography system), while maintaining short and low-impedance connections to the power supply terminals.

In an embodiment of the modulation device each thin conductive plate is configured for connecting to a respective one of the power supply terminals. This is particularly advantageous in case the control circuits have multiple power supply terminals having different supply voltages.

In an embodiment of the modulation device each of the conductive plates of one of the conductive slabs has a face terminating in one or more edges, and the plates are arranged with their faces substantially parallel to each other. A first effect is that the plates act as shielding plates for each other. Furthermore, such configuration allows for current-return paths which are nearby such that current loops can be kept small. This results in small inductances of the power supply lines, which is beneficial for power supply noise.

In an embodiment of the modulation device the face of each of the conductive plates of one of the conductive slabs is substantially equal in area. The advantage of this embodiment is that the shielding effect is enhanced, i.e. none of the plates extends beyond the other plates.

In an embodiment of the modulation device each of the conductive plates has a substantially uniform thickness. This also results in a uniform resistance and a uniform maximum current capacity of the plates.

In an embodiment of the modulation device a ratio of thickness of one of the conductive plates and a square root of the area of the face of the plate is less than 0.01. This configuration leads to a very good electrical performance in terms of low power supply resistance of the power supply connections.

In an embodiment of the modulation device each conductive plate of one of the conductive slabs has substantially the same resistivity relative to the other conductive plates of the conductive slab. This thicker conductive slab may be advantageously chosen to be the common power supply terminal, i.e. the electrical ground terminal, which acts as current-return path for all power supply terminals.

In an embodiment of the modulation device each conductive plate of one of the conductive slabs has substantially the same resistivity at every position over its extent relative to the other conductive plates of the conductive slab. Such configuration has the advantage that the power supply potentials are best defined (less susceptible to process and design variations).

In an embodiment of the modulation device at least one edge of each conductive plate is adapted for connection to a power supply and at least one different edge of each plate is adapted for connection to a plurality of the control circuits. In this embodiment the plurality of conductive plates in the conductive slabs can be coupled to the power supply, which may be conveniently integrated on a different substrate or plate.

In an embodiment of the modulation device the control circuits are distributed along substantially all of the length of the long edge of a non-beam area which borders the long edge of an adjacent beam area. This configuration leads to the shortest connections between the control circuits and the beamlet deflectors inside the beam area.

In an embodiment of the modulation device the connections between one of the conductive slabs and the control circuits in a non-beam area are distributed along substantially all of the length of the long edge of a non-beam area which borders the long edge of an adjacent beam area. This results in the best current distribution and is advantageous as it keeps parasitic inductances low.

In an embodiment of the modulation device the connections between the conductive slabs and the control circuits are made via a plurality of conductive bumps or solder joints on a surface of the body of the modulation device. This is a convenient way of forming the connections.

In an embodiment of the modulation device the conductive slabs comprise a first portion with a face parallel to the surface of the body where the bumps are located, and a larger second portion substantially perpendicular to the surface of the body. Such configuration eases the use of bumps to form the connections.

In an embodiment of the modulation device a first plurality of the conductive bumps or solder joints connect with a first one of the conductive plates of a conductive slab, and a second plurality of the conductive bumps connect with a second one of the conductive plates of the conductive slab.

In an embodiment of the modulation device at least one of the conductive slabs comprises a plurality of conductive plates arranged to conduct forward electrical current from a power supply to the control circuits and beamlet deflectors, and at least one conductive plate arranged to conduct return electrical current from the control circuits and beamlet deflectors to the power supply, wherein the forward electrical current is substantially equal to the return electrical current. Such configuration is advantageous for keeping the current loops small and parasitic inductances low. The conductive plates of each slab are preferably manufactured to have the same dimensions and the same resistivity. The forward and return electrical current through the conductive plates of each slab is preferably equal. Due to the shape of the plates, their uniform resistivity, and the very short separation between the plates, the parallel plates can approximately be considered as parallel infinite current sheets. Moreover, because the current flowing to the modulation device equals the return current flowing back to the power supply, the total sum of the linear current density on the conductive plates of each slab is close to zero. In a first order approximation, the magnetic field generated by a conductive slab is close to zero everywhere, except in the area between the conductive plates, so that a very good magnetic field cancellation can be established.

In an embodiment of the modulation device a ratio of the sum of the thickness of the plates which conduct forward electrical current and the sum of the thickness of the plates which conduct return electrical current is between 0.7 and 1.3, and preferably about 1.0. This configuration ensures that the current densities are uniform and thus also thermal effects (heating due to current flow) are more uniform.

In an embodiment of the modulation device a ratio of the distance between two adjacent conductive plates of one of the conductive slabs and the square root of the area of the face of the adjacent plates is less than 0.01. This configuration leads to a very good electrical performance in terms of low power parasitic inductance of the power supply connections.

In an embodiment of the modulation device the conductive slabs further comprise electrical insulation layers sandwiched between the conductive plates. One of the advantages of this embodiment is that the electrical insulating layers provide for mechanical stability of the conductive slabs.

In an embodiment of the modulation device the conductive slabs are rectangular, having two equal long edges and two equal short edges. This embodiment leads to a simple design ensuring a low impedance of the power supply connections.

In an embodiment of the modulation device the conductive lines from the plates to the light sensitive elements and the return lines are substantially perpendicular to the face of the plates.

In an embodiment of the modulation device the beam areas have a length and a width, the length being at least five times the width. This embodiment leads to a simple design ensuring a low impedance of the power supply connections.

In an embodiment of the modulation device the beam areas have a length and a width, the length being at least ten times the width. This embodiment leads to a simple design ensuring an even lower impedance of the power supply connections.

In an embodiment of the modulation device the beamlet deflectors arranged in two-dimensional arrays in the beam areas, each deflector provided with electrodes extending on opposing sides of an aperture for generating a voltage difference across the aperture. This configuration provides for a simple and compact array of beamlet deflectors.

In an embodiment of the modulation device the control circuits comprise a plurality of light sensitive elements arranged to receive modulated optical signals carrying the pattern data and converting the optical signals into electrical control signals for control of the beamlet deflectors. Receiving the signals in the modulation device optically has as great advantage that a vacuum barrier may be easily crossed without disturbing the vacuum, i.e. through a window or an optical fiber crossing the vacuum barrier.

In an embodiment of the modulation device the control circuits further comprise a plurality of demultiplexers, each demultiplexer arranged to receive a control signal from a corresponding one of the light sensitive elements, and demultiplex the control signal to generate a plurality of control signals to control a plurality of beamlet deflectors. In case optical fibers are used to transmit the signals to the manipulator optically, the bandwidth which is available is very large. Such bandwidth opens up the opportunity to share such optical fiber connection between multiple beamlet deflectors. An optical fiber has a certain dimension and thus costs space in a lithography apparatus. This is why the embodiment as here described is very convenient (enables maximum resource sharing while maintaining enough bandwidth).

In a second aspect the invention further relates to a charged particle lithography system comprising: i) a beam generator arranged for generating a plurality of charged particle beamlets divided into separate groups; ii) a modulation device according to any one of the preceding claims; and iii) a projection system arranged for projecting the modulated beamlets onto a target to be exposed. Furthermore, each beam area of the modulation device is positioned in the path of one of the groups of beamlets and each non-beam area is positioned outside the path of the groups of beamlets. The charged particle lithography system of the invention conveniently benefits from the modulation device of the invention. Such system has analogous embodiments as the embodiments of the modulation device of the invention.

In a third aspect the invention also relates to a power supply arrangement for use in the charged particle lithography system of the invention. The power supply arrangement comprises: i) at least one input terminal for receiving at least one input voltage; ii) at least two output terminals for supplying at least two different output voltages; iii) at least one DC-DC converter coupled between the at least one input terminal and the at least two output terminals, the at least one DC-DC converter being configured for converting the at least one input voltage into the at least two different output voltages; and iv) a conductive slab coupled to the at least two output terminals, the conductive slab being configured for being coupled to the power supply terminals of the modulation device for supplying electrical power to the modulation device, the conductive slab comprising a plurality of thin conductive plates. As follows from the discussion of the earlier embodiments, the invention may be also embodied in a power supply arrangement on which the conductive slab or slab is formed, wherein the conductive slab is configured for being coupled to and supplying power to the modulation devices. Similarly, each conductive slab comprises a plurality of conductive plates as described by the modulation device according to the invention.

An embodiment of the power supply arrangement comprises a plurality of conductive slabs arranged to supply electrical power to the power supply terminals, each conductive slab comprising a plurality of thin conductive plates. The advantages and effects of this embodiment are similar to that of the corresponding embodiments of the modulation device.

In an embodiment of the power supply arrangement each thin conductive plate is configured for connecting to a respective one of the power supply terminals. The advantages and effects of this embodiment are similar to that of the corresponding embodiments of the modulation device.

The power supply arrangement according to the third aspect has the same embodiments as the modulation device according to the first aspect.

In a fourth aspect of the invention, the invention provides a modulation device for use in a charged particle lithography system adapted to generate a plurality of groups of charged particle beamlets, the modulation device arranged for modulating the charged particle beamlets in accordance with pattern data and comprising a plate-like body, an array of beamlet deflectors arranged for deflecting the beamlets, a plurality of control circuits arranged to receive the pattern data and supply corresponding control signals to the beamlet deflectors, and a plurality of conductive slabs arranged to supply electrical power to the control circuits and beamlet deflectors; wherein the body of the modulation device is divided into a plurality of elongated beam areas and a plurality of elongated non-beam areas positioned adjacent to the beam areas so that a long edge of each beam area borders a long edge of an adjacent non-beam area; wherein the beamlet deflectors are arranged in groups, each group of beamlet deflectors located in one of the beam areas; wherein the control circuits are located in the non-beam areas, each control circuit located in one of the non-beam areas adjacent to one of the beam areas containing one or more of the beamlet deflectors receiving control signals from the control circuit; and wherein the conductive slabs are connected to the control circuits in the non-beam areas, each conductive slabs comprising a plurality of thin conductive plates.

The modulation device according to the fourth aspect has the same embodiments as the modulation device according to the first aspect.

The power supply arrangement provides relatively short power supply lines to the control circuits and beamlet deflectors. Conductive slabs (or conducting slabs) comprising a plurality of thin conductive (or conducting) plates (each plate connecting to a different power supply terminal) may be connected to the control circuits of the modulation device along all or a majority of the length of the slab, so that the conductive lines connecting the power supply to the control circuits and beamlet deflectors run in a direction substantially perpendicular to the face of the conductive slabs to minimize their length. Consequently, the magnetic field created by these interconnection lines can be minimized.

A reduction in magnetic fields is achieved by a specific configuration of the conductive slabs, which are each composed by a number of thin conductive plates arranged in parallel. The conductive plates of each slab are preferably manufactured to have the same dimensions and the same resistivity. The forward and return electrical current through the conductive plates of each slab is preferably equal. Due to the shape of the plates, their uniform resistivity, and the very short separation between the plates, the parallel plates can approximately be considered as parallel infinite current sheets. Moreover, because the current flowing to the modulation device equals the return current flowing back to the power supply, the total sum of the linear current density on the conductive plates of each slab is close to zero. In a first order approximation, the magnetic field generated by a conductive slab is close to zero everywhere, except in the area between the conductive plates, so that a very good magnetic field cancelation can be established.

In an embodiment the power supply provided by each conductive slab is effectively isolated from the others, so that there is no undesirable current flowing between the conductive slabs through the modulation device. The features of this embodiment are applicable to all mentioned embodiments of the invention.

A fifth aspect of the invention relates to a conductive slab for electrically connecting a power source to a load. The conductive slab comprises a plurality of conductive plates. Each plate has a face terminating in one or more edges. Each conductive plate has a substantially uniform thickness, and is sufficiently thin. Preferably a ratio of the thickness of each plate and a square root of the area of the face of that plate is less than 0.01. The plates are arranged with their faces substantially parallel to each other.

The conductive slab of the fifth aspect of the invention may be arranged in any one of the first to the fourth aspect of the invention and may include one of more of the features of the conductive slab described in the first to fifth aspect of the invention.

BRIEF DESCRIPTION OF THE DRAWINGS

These and other objects of the invention will be further described with reference to the drawings in which.

DESCRIPTION OF ILLUSTRATIVE EMBODIMENTS

Figure 1:
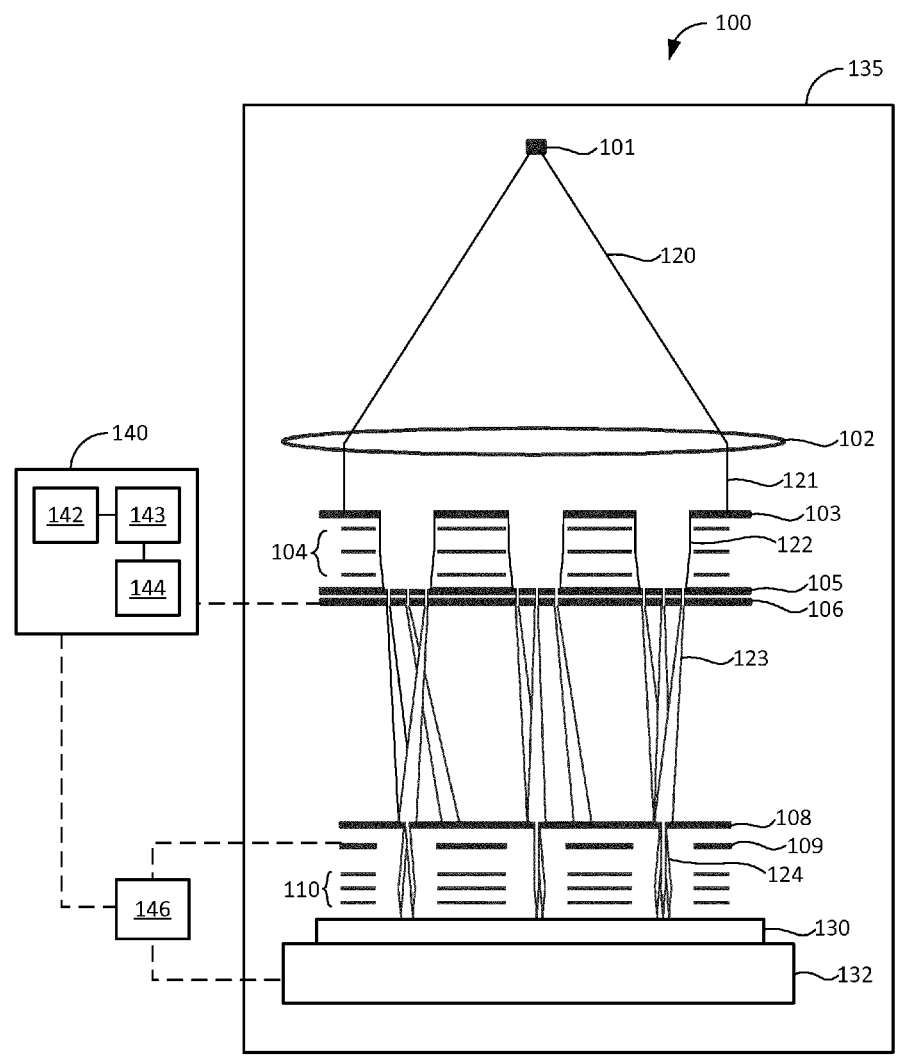
FIG. 1 shows a conceptual schematic diagram of a charged particle multi-beamlet lithography system.

The following is a description of certain embodiments of the invention, given by way of example only and with reference to the drawings. The drawings are not drawn to scale and merely intended for illustrative purposes. Equivalent elements in different drawings are referred to with same reference numerals.

FIG. 1 shows the conceptual schematic drawing of a charged particle multi-beamlet lithography system 100 based upon an electron beam optical system without a common cross-over of all the electron beamlets. Such lithography systems are described for example in U.S. Pat. Nos. 6,897,458 and 6,958,804 and 7,019,908 and 7,084,414 and 7,129,502 and 8,089,056, U.S. patent application publication no. 2007/0064213 and 2009/0261267 and US 2011/0079739 and US 2012/0091358, which are all assigned to the owner of the present invention and are all hereby incorporated by reference in their entirety.

In the embodiment shown in FIG. 1, the lithography apparatus 100 comprises an electron-optical column having an electron source 101 for producing an expanding electron beam 120. The expanding electron beam 120 is collimated by collimator lens system 102. The collimated electron beam 121 impinges on an aperture array 103, which blocks part of the beam to create a plurality of sub-beams 122. A condenser lens array 104 is included behind aperture array 103, for focusing the sub-beams 122, e.g. towards a corresponding opening in the beam stop array 108. The sub-beams 122 impinge a multi-aperture array 105 which blocks part of each sub-beam to create a plurality of beamlets 123 from each sub-beam 122. In this example, the aperture array 105 produces three beamlets from each sub-beam, but in practice a much larger number of beamlets may be produced, e.g. 49 beamlets per sub-beam or more, so that the system generates a very large number of beamlets 122, preferably about 10,000 to 1,000,000 beamlets.

The electron beamlets 123 pass through apertures in a beamlet blanker array 106. The aperture array 105 may be integrated with the beamlet blanker array 106, e.g. arranged close together or as a single unit. The beamlet blanker array 106 and beam stop array 108 operate together to modulate or switch beamlets on or off. The beam blanker array 106 includes a plurality of beamlet deflectors, which may be in the form of blanker electrodes positioned near each aperture of the array. By introducing a voltage across the blanker electrodes of an aperture, the beamlet or beamlets passing through the aperture may be slightly deflected. After passing through the beamlet blanker array, the beamlets 123 arrive at beam stop array 108, which has a plurality of apertures positioned so that the undeflected beamlets pass through the beam stop array and deflected beamlets are blocked by the beam stop array (or vice versa). If beamlet blanker array 106 deflects a beamlet, it will not pass through the corresponding aperture in beam stop array 108, but instead will be blocked. But if beamlet blanker array 106 does not deflect a beamlet, then it will pass through the corresponding aperture in beam stop array 108, and through beam deflection array 109 and projection lens arrays 110. Thus, the beamlet blanker array 106 and beam stop array 108 operate together to block or let pass the beamlets 123.

Beam deflector array 109 provides for deflection of the beamlets 124 in the X and/or Y direction substantially perpendicular to the direction of the undeflected beamlets, to scan the beamlets across the surface of target or substrate 130. Next, the beamlets 124 pass through projection lens arrays 110 and are projected onto the surface of substrate 130. The projection lens arrangement preferably provides a demagnification of about 100 to 500 times. The beamlets 124 impinge on the surface of substrate 130 positioned on moveable stage 132 for carrying the substrate. For lithography applications, the substrate usually comprises a wafer provided with a charged-particle sensitive layer or resist layer.

A control unit 140 may be provided for providing signals for control of the beamlet blanker array 106. The control unit 140 may comprise a data storage unit 142, a processor unit 143 and data converter 144. The control unit 140 may be located remote from the rest of the system, for example outside the inner part of a clean room. The control system may further be connected to an actuator system 146 for control of movement of the moveable stage 132 and scanning of the beamlets by the deflector array 109. The control unit 140 may be arranged for processing pattern data to generate signals for control of the blanker electrodes. The pattern data may be converted to modulated light beams for transmission to the beamlet blanker array 106 using optical fibers, and the modulated light beams projected from optical fiber ends onto corresponding light sensitive elements located on the beamlet blanker array 106. The light sensitive elements may be arranged to convert the light signals into electrical signals for control of the blanker electrodes.

The charged particle lithography apparatus 100 operates in a vacuum environment. A vacuum is desired to remove particles which may be ionized by the charged particle beams and become attracted to the source, may dissociate and be deposited onto the machine components, and may disperse the charged particle beams. A vacuum of at least $10^{-6}$ bar is typically required. In order to maintain the vacuum environment, the charged particle lithography system is located in a vacuum chamber 135. All of the major elements of the lithography apparatus 100 are preferably housed in a common vacuum chamber, including the charged particle source, projector system for projecting the beamlets onto the substrate, and the moveable stage.

Figure 2:
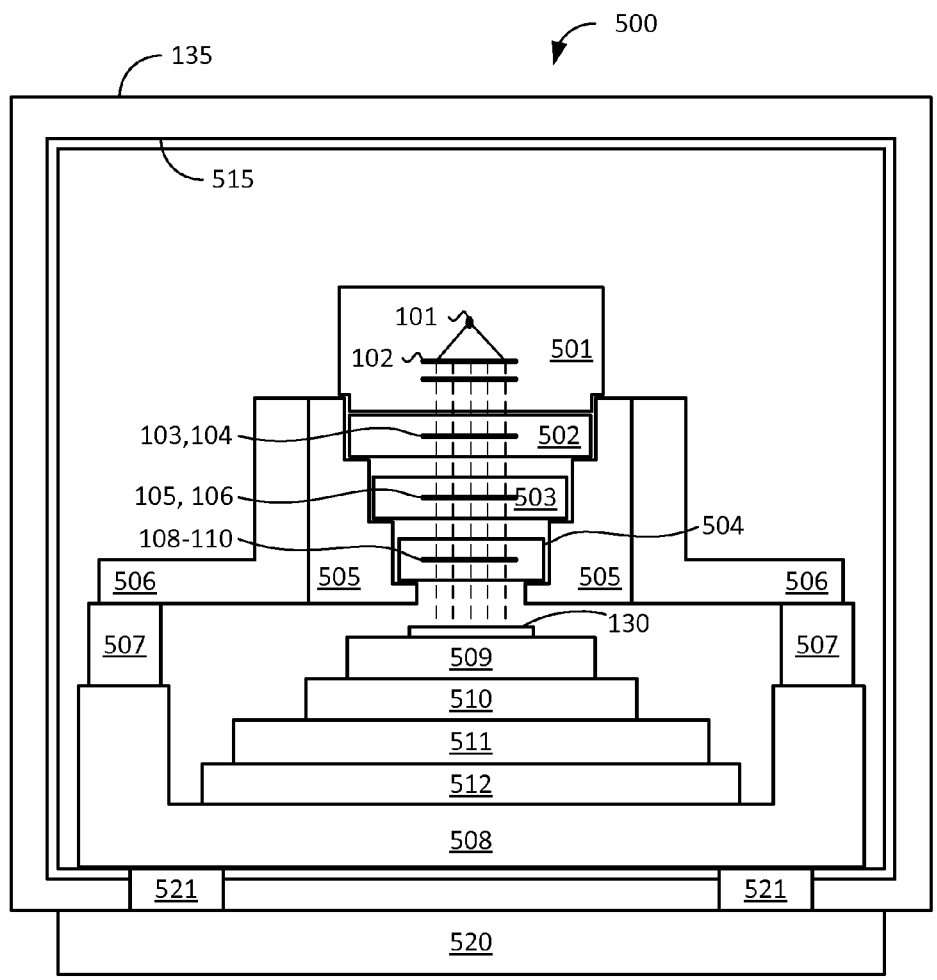
FIG. 2 shows a modular arrangement of components of the lithography system of FIG. 1.

FIG. 2 shows a simplified block diagram illustrating the principal elements of a modular lithography apparatus 500. The lithography apparatus 500 is preferably designed in a modular fashion to permit ease of maintenance. Major subsystems are preferably constructed in self-contained and removable modules, so that they can be removed from the lithography apparatus with as little disturbance to other subsystems as possible. This is particularly advantageous for a lithography machine enclosed in a vacuum chamber, where access to the machine is limited. Thus, a faulty subsystem can be removed and replaced quickly, without unnecessarily disconnecting or disturbing other systems.

In the embodiment shown in FIG. 2, these modular subsystems include an illumination optics module 501 including the charged particle beam source 101 and beam collimating system 102, an aperture array and condenser lens module 502 including aperture array 103 and condenser lens array 104, a beam switching module 503 including the multi-aperture array 105 and beamlet blanker array 106, and projection optics module 504 including beam stop array 108, beam deflector array 109, and projection lens arrays 110. The modules are designed to slide in and out from an alignment frame. In the embodiment shown in FIG. 2, the alignment frame comprises an alignment inner subframe 505 and an alignment outer subframe 506. A frame 508 supports the alignment subframes 505 and 506 via vibration damping mounts 507. The substrate 130 rests on substrate support structure 509, which is in turn placed on a chuck 510. The chuck 510 sits on the stage short stroke 511 and long stroke 512. The lithography apparatus is enclosed in vacuum chamber 135, which may include a mu metal shielding layer or layers 515, and rests on base plate 520 supported by frame members 521.

It goes without saying that the beamlet blanker array 106 cannot function without a power supply. When beamlet blanker array 106 is connected to a power supply and operates, electrical current flows through the power supply, the connection wires between the power supply and the circuits on the beamlet blanker array, and the circuits and conductive elements on the substrate of the beamlet blanker array. These electrical currents will all generate magnetic fields, which may cause undesirable deflection of the electron beamlets and introduce errors into the exposure performed by the lithography system. As will be seen, the present invention aims to effectively reduce these magnetic fields so that operation of the lithography system can be optimized.

Figure 3:
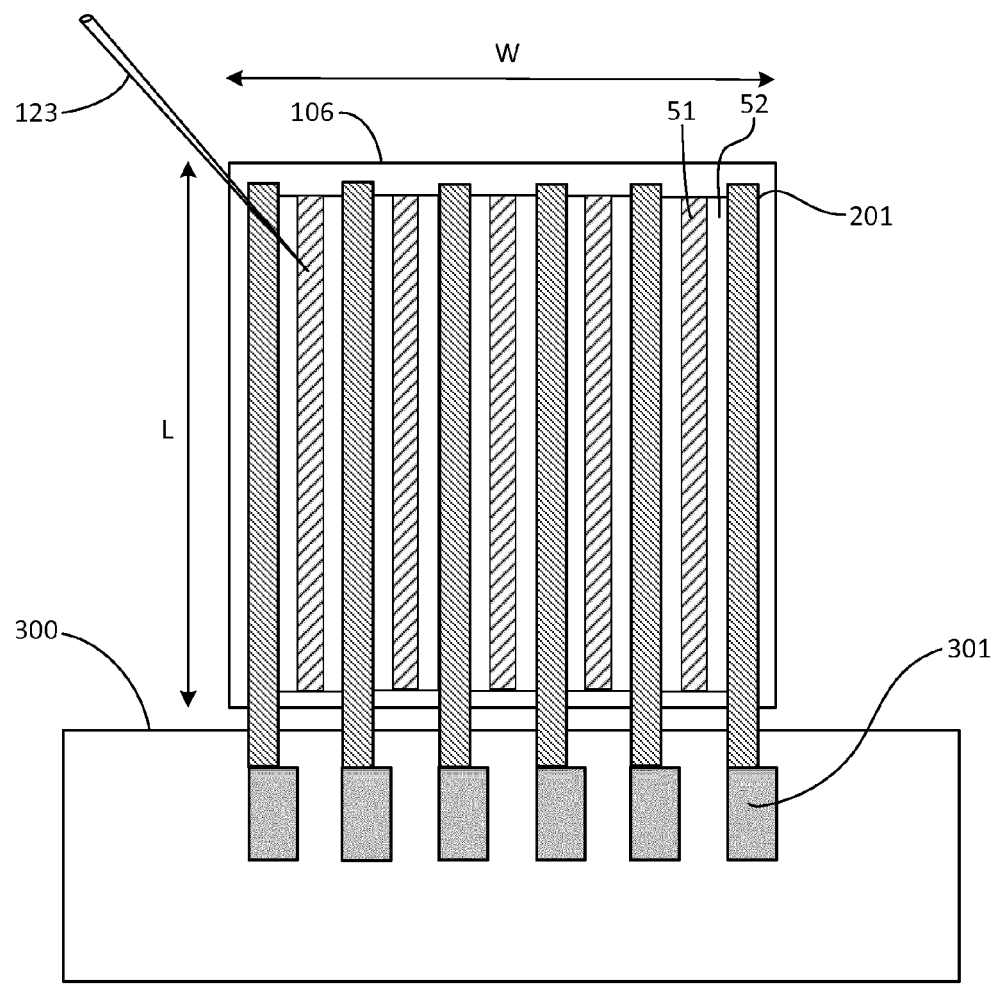
FIG. 3 shows a simplified, schematic view of a interconnection structure of a beamlet blanker array and power supply.

FIG. 3 shows a simplified schematic view of an interconnection structure of the beamlet blanker array 106 and the power supply in one embodiment of the invention. The power supply comprises a number of power slabs 201 in the form of thin conductive plates, a common power unit 300, and a number of power supply connections 301. In the embodiment shown, there are six power slabs 201. Each power slab 201 takes the form of a thin rectangle plate, with a large face terminating at thin edges, and having a long edge and a short edge as can be seen more clearly in FIGS. 6 and 7, although other shapes may also be used. The power slabs 201 are oriented substantially perpendicular to the surface of the blanker array 106 (i.e. with the face of the power slab perpendicular or nearly perpendicular to the surface of the blanker array), having one of the long edges parallel to the surface of the blanker array 106 for making connections thereto, and one of the short edges perpendicular to (or at an angle to) the surface of the blanker array 106 for making connections to the power unit 300 via power supply connectors 301. Instead of a rectangular structure, the slab may have a fixed width throughout the trajectory between the side at which connection is made with the blanker array 106 and the side connected to the power unit 300. It can be readily understood, that instead of a slab, in this case a ribbon cable, i.e. a ribbon comprising a plurality of parallel conductors, may be used as well.

FIG. 3 also shows the subdivision of the beamlet blanker array 106 into beam areas 51 and non-beam areas 52. The electron beamlets 123 are directed onto the beam areas 51 of the beamlet blanker array 106 by the upstream elements of the lithography system. A beam area 51 includes the apertures (holes in the beamlet blanker array substrate) through which the electron beamlets 123 pass, the blanker electrodes positioned adjacent to the apertures for deflecting the electron beamlets 123, and conductive lines connecting the blanker electrodes to circuits for energizing the blanker electrodes. A non-beam area 52, on the other hand, is positioned outside the normal path of the beamlets 123, and includes circuits for control of the blanker electrodes located in the adjacent beam areas 51. A non-beam area 52 may include light sensitive elements such as photo-diodes for receiving modulated optical signals carrying the pattern data and converting the optical signals into electrical signals for control the beamlet deflectors. Optical fibers for guiding the modulated optical signals towards the light sensitive elements may also be routed in the non-beam areas to avoid interfering with the beamlets 123. Power slabs 201 are also positioned in the non-beam areas to avoid interfering with the beamlets 123 and the connections between the power slabs and the circuits on the beamlet blanker array 106 are also made in the non-beam areas 52.

In one embodiment, blanker array 106 typically has a length L in a direction parallel to the power slabs 201 of between 15 and 35 mm, for example about 33 mm, and a width W in a direction perpendicular to the power slabs of between 10 and 50 mm. In one embodiment, the active area of the blanker array 106 (e.g. encompassing all the beam areas 51) is in the form of square of 33 mm×30 mm. The width of a beam area 51 can be varied to an appropriate value, for example in a range between 0.1 and 5 mm. In one embodiment, the width of the beam areas 51 and non-beam areas 52 is about 2.0 mm.

In one embodiment, as shown in FIG. 3, each beam area 51 may be served by two adjacent non-beam areas 52. Thus, the beamlet deflectors in a beam area are controlled by signals received by light sensitive elements in the non-beam areas located on both sides of the beam area. Moreover, for each beam area 51, electrical power is supplied by the two adjacent power slabs 201 connected to the non-beam areas on either side of the beam area.

Figure 4:
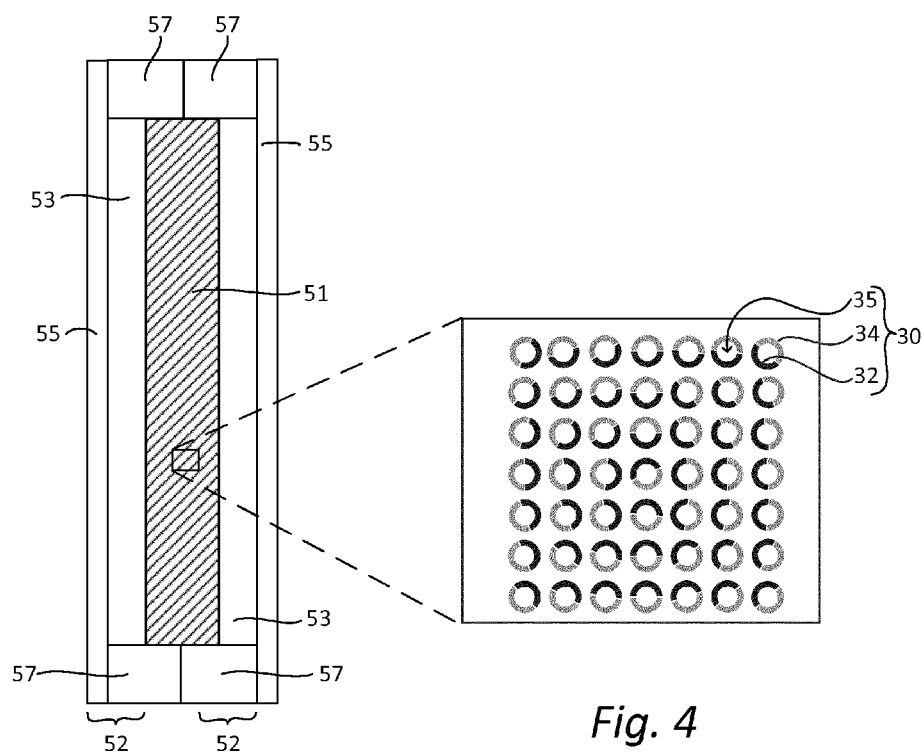
FIG. 4 schematically shows a top view of a more detailed lay-out of a portion of a beamlet blanker array.

FIG. 4 schematically shows a top view of a more detailed lay-out of a portion of a beamlet blanker array showing a single beam area 51. The beamlet blanker array further includes a non-beam area 52 on each side of the beam area and containing the electrical circuits and components responsible for controlling the deflection of the beamlets 123 which pass through the beam area. In this embodiment, the non-beam areas 52 effectively cover all the surface area of the beamlet blanker array 106 that is not reserved for the beam area. Power is supplied by two power slabs 201 connected to the non-beam area 52.

The non-beam areas 52 include an optical interface area 53 and a power interface area 55, and may further include an additional interface area 57. The optical interface area 53 is reserved for establishing an optical interface between a plurality of optical fibers and light sensitive elements on the beamlet blanker array. The optical fibers are arranged for guiding the modulated light beams towards the light sensitive elements placed within the optical interface area 53. The optical fibers are suitably arranged so that they do not physically block electron beamlets within the beam area 51 during use of the lithography system, e.g. as shown in FIG. 6b.

In one embodiment, the optical interface area 53 is a long rectangular area (e.g. 33 mm×2.0 mm). One long edge of the optical interface area 53 is the boundary with the beam area 51. The beamlet deflectors 30 in the beam area 51 are distributed along the length of the beam area. The light sensitive elements are preferably distributed along the length of the optical interface area 53 so that each light sensitive element is located close to the beamlet deflector(s) 30 in the beam area 51 which are controlled by signals from the light sensitive element. The other long edge of the optical interface area 53 is the boundary with the power interface area 55 where the power slab 201 is connected.

The power interface area 55 is arranged to accommodate a power arrangement for suitably powering the light sensitive elements and other components within the optical interface area 53, and the beamlet deflectors 30 in the beam area 51. As also shown in FIG. 3, the power slabs 201 extend in a direction substantially perpendicular to, and away from the blanker array. This arrangement enables the spread of the power lines over a large surface area, which improves the efficiency and reduces losses, e.g. due to a reduced thermal resistance caused by an increased radiation surface area.

Electrical connections between the power slabs 201 and the circuits on the beamlet blanker array 106 are preferably distributed along the length of a long edge of the power slabs. The position of the power slabs 201 on the sides of the optical interface area 53 enables the use of relatively short power supply lines from each power slab to adjacent light sensitive elements and other circuits required for driving the blanker electrodes 30.

The arrangement of an elongated beam area 51 containing beamlet deflectors 30 distributed along its length, adjacent elongated optical interface areas 53 containing light sensitive elements 40 distributed along their length, and elongated power interface areas 55 adjacent to the optical interface areas 53 containing electrical connections to elongated power slabs 201 distributed along their length, combines to reduce the distance from a power slab to the beamlet deflector powered by that power slab. The conductive power supply lines from the power slab to the light sensitive elements and other circuits for driving the beamlet deflectors, and the return (power supply common) lines, can be arranged substantially perpendicular to the long edge of the power slabs, to minimize the distance of these conductive lines. Consequently, the magnetic fields created by these conductive lines can be minimized. Furthermore, variations in voltage drop between different power supply lines can also be reduced by reducing the variation in length of the lines, e.g. connections to light sensitive elements closer to a power slab versus connections to light sensitive elements further away. In the above-mentioned embodiment, the optical interface area 53 is a long, thin, rectangular area, e.g. 33 mm×2.0 mm. In this embodiment, the distance between a light sensitive element and the adjacent power slab 201 varies by a maximum of 4 mm, although the light sensitive elements can be positioned at any place in a 66 mm$^2$ area. As a result, the variation in voltage drop between power supply lines can be largely reduced.

The non-beam area 52 may further include an additional interface area 57 to accommodate further circuitry, for example clock and/or control circuits. The power slabs 201 may also be arranged to provide sufficient power to the additional interface area 57 to power these additional circuits.

The beam area 51 comprises the beamlet deflectors 30. The beamlet deflectors 30 are preferably electrostatic deflectors with a first electrode 32 and a second electrode 34. FIG. 4 shows an arrangement of individual beamlet deflectors 30. The deflectors 30 may comprise at least one concave electrode 32 or 34. Suitably, as in the embodiment shown, both electrodes 32, 34 have a concave shape. Apertures 35 extend through the beamlet array substrate in the beam area 51 between the electrodes 32, 34. The concave shape results in the electrodes 32, 34 having a shape conformed to the cylindrical apertures 35. This cylindrical aperture shape is in itself suitable for preventing the introduction of certain optical aberrations, such as astigmatism. By carefully choosing the layout and deflection direction, the deflection of the beamlets can be spread out in all directions, preventing undesirable buildup of charge in specific locations of the lithography system.

Figure 5:
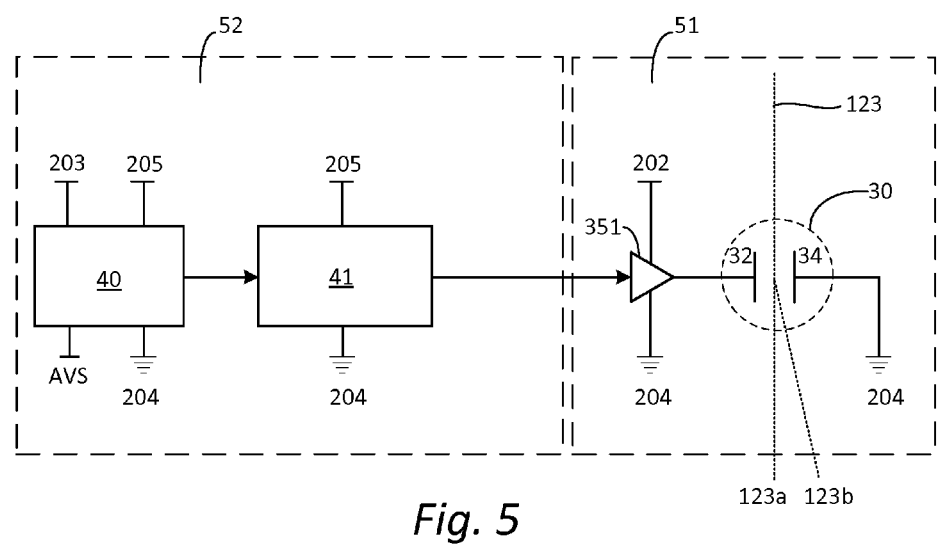
FIG. 5 shows a simplified schematic view of a circuit for energizing deflectors in the beamlet blanker array.

FIG. 5 shows a simplified schematic view of one embodiment of a circuit for control of the beamlet deflectors 30. The circuit shown comprises a light sensitive element 40, a demultiplexer 41, a driver circuit (e.g. an operational amplifier) 351, a first electrode 32, and a second electrode 34. A demultiplexer 41 may control plural deflectors 30. In the embodiment shown, the light sensitive element 40 is embodied in an optical front end circuit. The circuits are supplied by three power supply terminals 202, 203, 205, and have a common power supply terminal 204. The power supply terminals may also be referred to as voltage sources and the common power supply terminal as power supply common. However, electrically such common power supply terminal 204 may not be considered a single electrical node from an electrical point-of-view, because of significant parasitic impedances of the power wires. For example, in one embodiment the power supply terminal 202 supplies 3.3 VDC, power supply terminal 203 supplies 2.2 VDC, and power supply terminal 205 supplies 1.0 VDC.

The light sensitive element 40 is served by power supply terminals 203 and 205 and is positioned in the non-beam area 52. In one embodiment, an optical signal, which carries multiplexed pattern data for control of a group of beamlet deflectors, is directed onto a light sensitive element 40. The light sensitive element 40 converts the optical signal into an electrical signal, and sends the electrical signal to a demultiplexer 41, which is served by power supply terminal 205. The demultiplexer 41 demultiplexes the electrical signal to derive separate control signals for control of each individual beamlet deflector 30 in the group.

If a specific beamlet 123 is to be deflected, an energizing signal is transmitted to a driving circuit 351, which is located in the beam area 51 close to the relevant first electrode 32. The driving circuit 351, which is served by power supply terminal 202, amplifies the signal and provides the required voltage difference between first electrode 32 and second electrode 34 to deflect the incident electron beam 123. On the other hand, if a specific beamlet 123 is not to be deflected, the corresponding first electrode 32 will not be energized. In this case the incident electron beam 123 passes through the beamlet deflector 30 without being deflected.

The light sensitive element 40, the demultiplexer 41, the driving circuit 351 and the second electrode 34 are all connected to a power supply common 204 which carries the return current to the power supply.

Figure 6A:
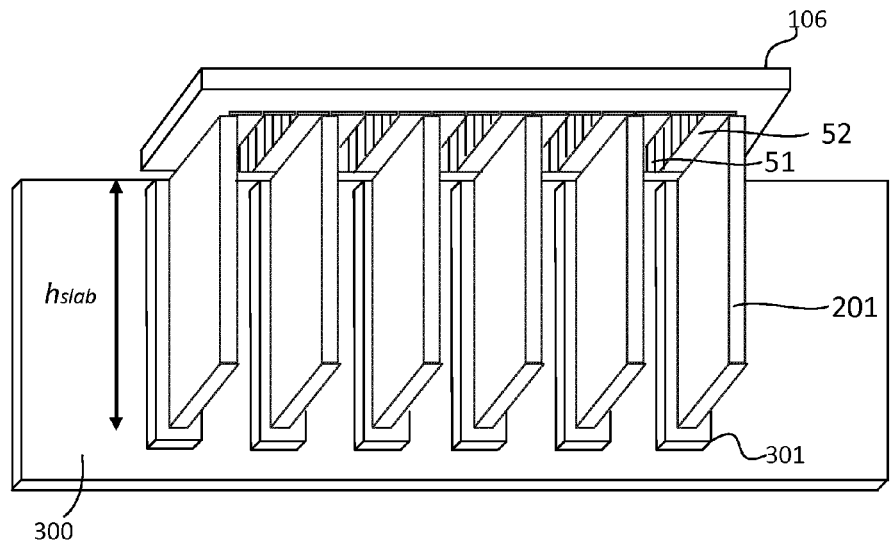
FIG. 6a and 6b shows a simplified diagram of an arrangement of a beamlet blanker array and power slabs.
Figure 6B:
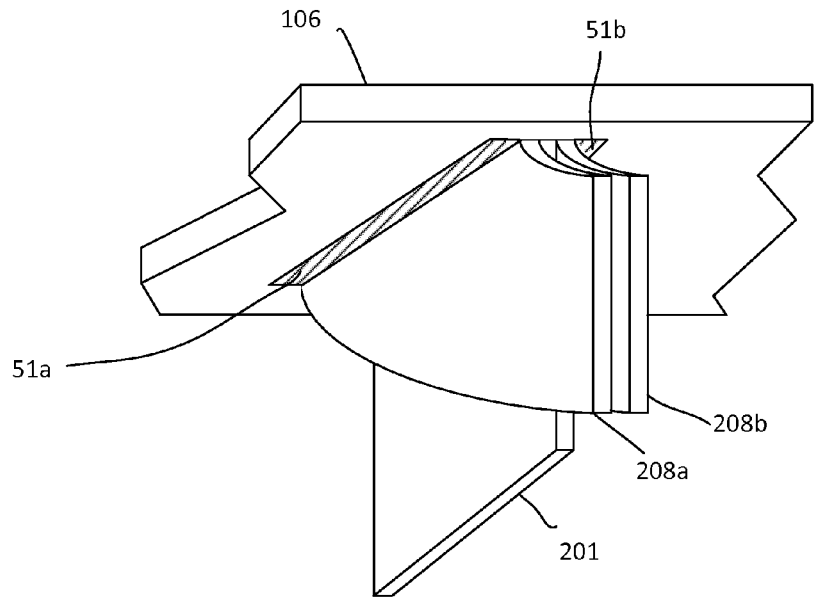

FIG. 6a shows a simplified view of an arrangement of the beamlet blanker array 106 and multiple power slabs 201. Each power slab 201 is placed perpendicular to the surface of the beamlet blanker array 106 in a non-beam area 52 between adjacent beam areas 51. Each power slab 201 has connections to the circuits on the beamlet blanker array 106 along substantially all the length the power slab which runs adjacent to the beam area 51 where the beamlet deflectors are located. Each power slab 201 also has connections to the power supply 300 via a connector 301, the connections made along substantially all the length of the side of the power slab facing the power supply 300.

FIG. 6b shows a simplified view of an arrangement of the beamlet blanker array 106 showing a single power slab 201 located next to one or more optical fiber bundles 208. In this embodiment the power slab 201 is between two optical fiber bundles 208a and 208b all connected to the beamlet blanker array between beam areas 51a and 51b. The power slab 201 serves half of the beamlet deflectors in both beam areas 51a and 51b on each side of the power slab, and the optical fiber bundle 208a and 208b serve half of the beamlet deflectors in beam areas 51a and 51b respectively.

Figure 7A:
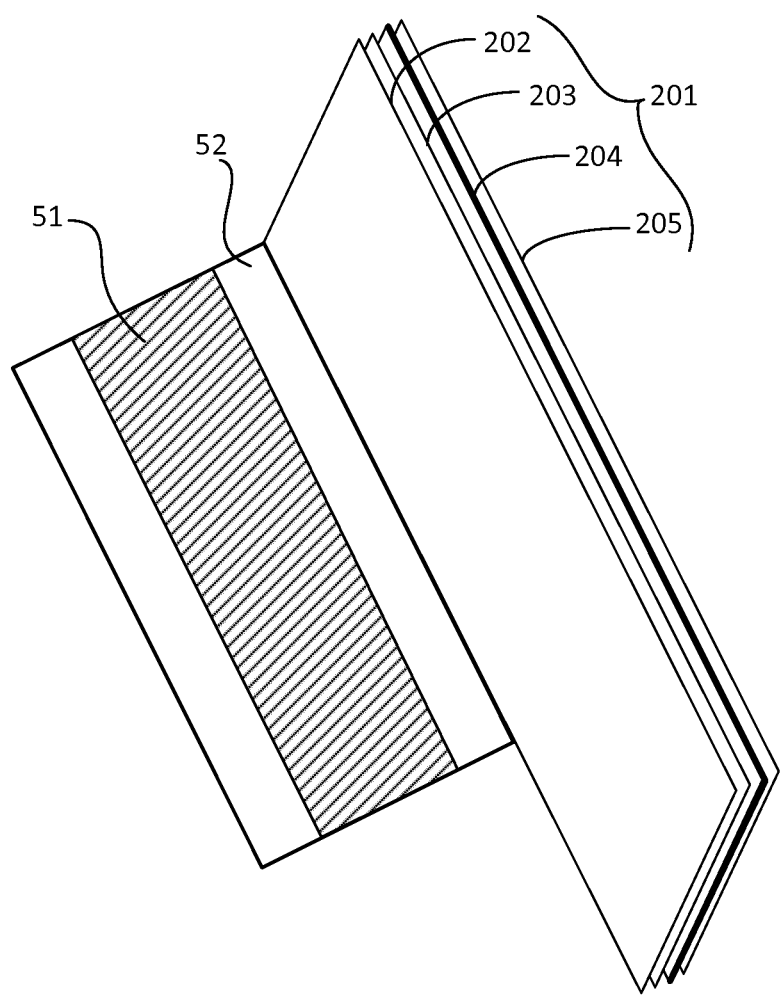
FIG. 7a shows a more detailed diagram showing connection of one of the power slabs of the FIG. 5 embodiment.

FIG. 7a shows a more detailed perspective view of a connection between a power slab 201 and beamlet blanker array 106. Each power slab 201 comprises one or more thin conductive plates arranged in parallel. The embodiment shown comprises four power plates 202 to 205. Each power plate may be connected to the power supply 300 for supply of a different voltage to the beamlet blanker array. For example, in one embodiment power plates 202 to 205 may serve as power supply terminal 202 (e.g. 3.3 VDC), power supply terminal 203 (e.g. 2.2 VDC), power supply common 204, and power supply terminal 205 (e.g. 1 VDC), respectively. The material of these power plates is preferably a good conductor and suitable for making a thin plate of uniform dimensions, such as copper. Three electrical insulation layers are sandwiched between the four power plates 202 to 205 in order to maintain a very thin structure of the power slab 201. The two outer faces of the power plate 202 and 205 may also be covered by insulation layers.

In one embodiment, the power plates 202 to 205 are in the form of rectangular plates. The plates 202 to 205 of each power slab 201 preferably have approximately the same length and height, while the thickness of each plate may vary. Each plate preferably has a uniform thickness and uniform resistivity over its extent. In a more specific embodiment, the height $h_{slab}$ of each power plate is approximately 28 mm; the length is slightly greater (including allowance for connection to the power supply connectors 301); the distance between two adjacent plates is approximately 5 μm; the thickness of an electrical insulation layer sandwiched between the power plates 202 to 205 is approximately 10 μm (i.e. the distance between two adjacent plates); the thickness of an outer electrical insulation layer may be thicker or thinner, for example, 8 μm; the thickness of power plates 202, 203 and 205 is approximately 4 μm and the thickness of power plate 204 is approximately 15 μm. The sum of the thicknesses, the distances of the power plates 202 to 205 (i.e. the thickness of the power slab 201) and one outer insulation layer on the power plate 202, is about 60 μm.

As the power plate 204 receives all electrical current flowing in the return circuit to the power supply, the current flowing through it is more than the current flowing in each of the other plates (and is preferably equal to the combined current flowing through all the other plates of the power slab). So it is preferable that power plate 204 has a sufficiently larger thickness to reduce its resistivity to result in approximately equal thermal expansion under expected operating conditions as the other plates of the power slab. More generally, where different plates of the power slab carry different currents in operation, the relative thicknesses of the plates is preferably arranged so that the expected thermal expansion of the plates, due to the flow of current through the plates, is approximately equal.

It should be noted that, for the power plates 202 to 205, the relative scale of the length, height, thickness and distances is more important than the absolute scale. The length, height, thickness and distances may vary together to be smaller or larger. The power plates 202 to 205 are preferably manufactured to have the same, relative to each other, resistivity at every position. Because of the shape of the power plates 202 to 205 and their uniform resistivity, electrical current flows uniformly in the plates in operation.

As a general rule in a closed conductive circuit, the overall current flowing from the power supply equals the current flowing in the return circuit. Defining the current flowing in the return circuit as negative for convenience, the sum of the current flowing through the power plates 202 to 205 is preferably approximately zero.

Moreover, as the current flows uniformly on the plates 202 to 205 due to their uniform resistivity, and as the power plates 202 to 205 have the same area (i.e. each of them has the same length and has the same height), the sum of the line current density J (i.e. the current flowing through a unit length) on the power plates 202 to 205 is also zero, that is, $$J_{202}+J_{203}+J_{204}+J_{205}=0.$$

It should be recalled that the magnetic field generated by an infinite current sheet (e.g. a conductive plate of infinite size through which the current uniformly flows) is of the form:

$$B = \frac{\mu_0 J}{2}.$$

In other words, the magnetic field generated by an infinite current sheet is proportional to the current density, and does not vary with distance from the current sheet. In the present invention, the power plates 202 to 205 are sufficiently large and thin, i.e. the order of length and height of the plates is much higher than thickness, the plates are sufficiently uniform in thickness, and the plates are placed sufficiently close to each other, that the case of infinite current sheets turns out to be a good approximation. Combining the two equations above, a desirable result can be obtained. That is, in the area outside the space between the power plates 202 to 205, such as in the beam area 51, the magnetic field effectively vanishes in the first order approximation:

$$B \approx \frac{\mu_0(J_{202} + J_{203} + J_{204} + J_{205})}{2} = 0.$$

As a result, a very good cancellation of the magnetic fields generated by the plates of each power slab can be established.

Figure 7B:
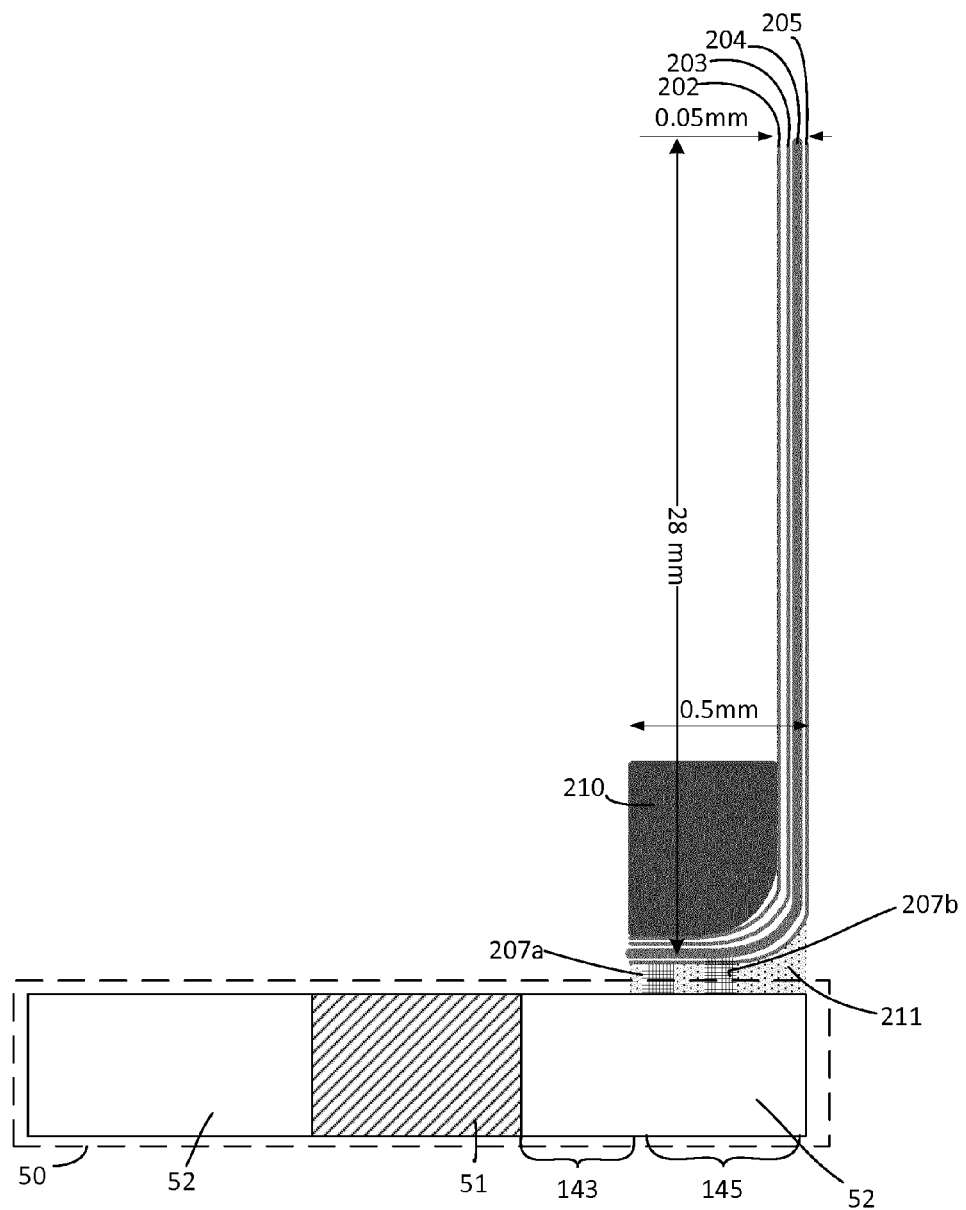
FIG. 7b shows a cross-sectional view of a connection of one of the power slabs of the FIG. 7a embodiment.

FIG. 7b shows an embodiment of the connection between the power plates 202 to 205 of a power slab 201 and a non-beam area 52. In the embodiment shown here, the beamlet blanker array 106 is comprised of multiple chips 50, each chip encompassing a beam area 51 and a non-beam area 52 on each side surrounding the beam area, the non-beam area divided into an optical interface area 143 and a power interface area 145. The circuits in the non-beam area are connected to the power plates 202 to 205 through a number of conductive bumps 207 in the power interface area 145. Each power plate may be connected separately to the chip 50 through a separate set of bumps 207. The bumps 207 make an electrical connection between conductive lines on the surface of the chip 50 to one of the plates of the power slab 201. The bumps 207 may be e.g. solder bumps, for making secure and low resistance connections. Other types of connection other than bumps, such as flexible interconnects, may also be used.

A series of bumps 207 or solder joints preferably extends along the length of the elongated non-beam area 52, making electrical connections along substantially the whole length of the power slab 201 overlapping with the optical interface area 143, to the circuits located along the length of the optical interface area 143. Multiple sets of bumps may be used, each set of bumps connecting to a separate plate of the power slab 201. In this embodiment, pits are formed in the surface of the power slab 201 at locations corresponding to the locations of the bumps 207 to enable the bumps to penetrate through the layers of the power slab to make electrical contact with a desired power plate. For example, in FIG. 7b a first bump 207a of a first set of bumps is shown connected to conductive plate 205, while a second bump 207b of a second set of bumps sits in a corresponding pit to connect to conductive plate 204. Only two sets with bumps are shown in FIG. 7b for simplicity, but it will be understood that four sets of bumps may be used make separate connections to each of the four plates shown in this embodiment.

In the embodiment shown in FIG. 7a, the power slab is formed with a bend of substantially 90 degrees along its length, to form a first portion with its face facing parallel to the surface of the power interface area 145 and connecting with the bumps 207, and a second portion with its face extending substantially perpendicular to the surface of the chip 50. A filling material 211 may be placed in the gap between the first portion of the power slab and the surface of the power interface area 145 of chip 50. This may be an adhesive material to strengthen the bond between the power slab and the chip. A rigid bending profile 210 may be disposed on the surface facing away from the chip of the first portion of the power slab where the connections to the chip are made. The power slab may be affixed to the bending profile, e.g. using an adhesive, to stiffen the assembly and maintain the 90 degree bend in the slab. To make this structure, the power slab 201 may be manufactured as a flat structure of parallel plates, the plates are connected in the first portion of the power slab to the chip 50 via the bumps 207, the bending profile 210 is placed on the first portion of the power slab facing away from the chip 50, the power slab bent around the bending profile by 90 degrees, and the underfill placed in the gap between the first portion of the power slab and the chip.

Figure 7C:
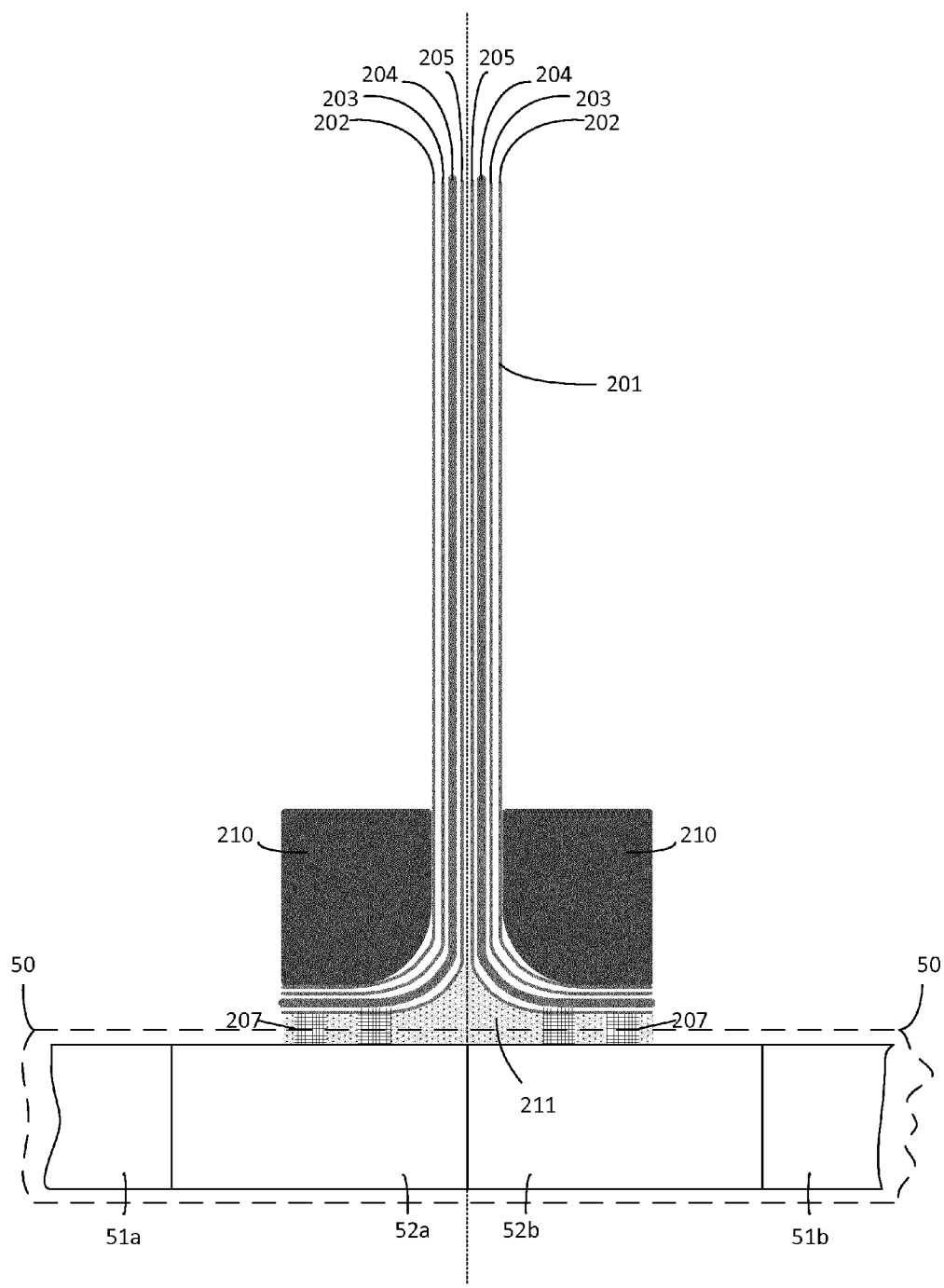
FIG. 7c shows a cross-sectional view of another connection arrangement of two power slabs.

FIG. 7c shows a detailed perspective view of another embodiment of a power slab 201. In this embodiment, a single power slab 201 is formed from two separate sets of power plates 201 to 205 each with a first portion as described above for connection to the chip, to provide power to two separate adjacent beam areas 51. Two adjoining chips 50a, 50b are shown, with adjoining non-beam areas 52a, 52b each connected to a respective first portion of the power slab 201. This embodiment may comprise two separate copies of the embodiment shown in FIG. 7b, each being constructed separately and combined by gluing the second portions of each power slab to each other.

Figure 8:
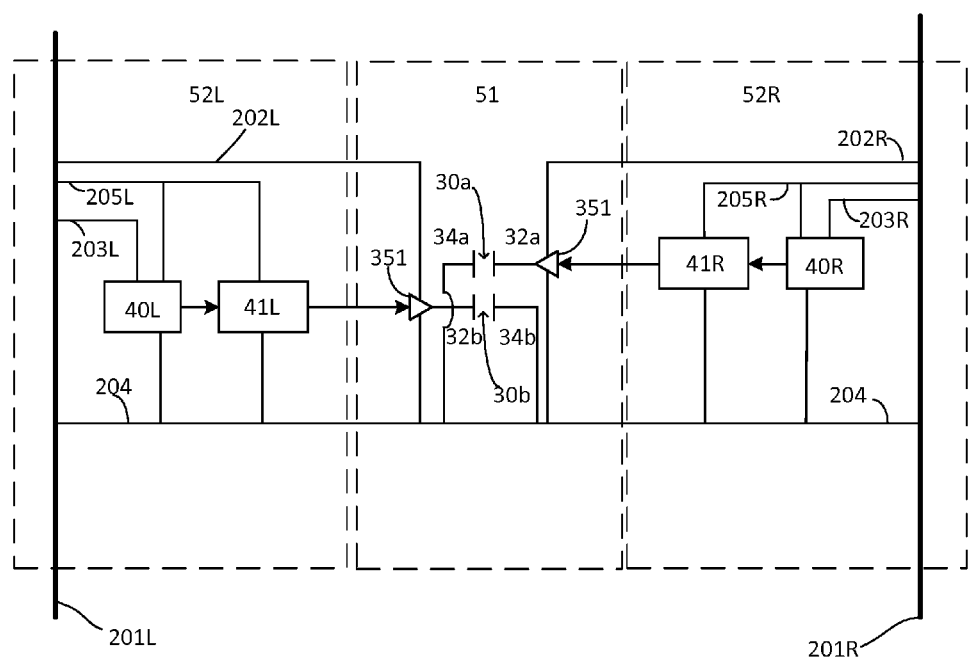
FIG. 8 shows a simplified conceptual diagram of electrical isolation in the beam area of a beamlet blanker array.

FIG. 8 shows a simplified schematic diagram of a control circuit for the beamlet deflectors, showing the isolation between the electrical circuits in the non-beam areas 52L, 52R on each side of a beam area 51. As seen a beam area 51 is served by the both adjacent non-beam areas 52L and 52R. In the embodiment shown, the beam area 51 is divided into two at least to some extent isolated halves. For the power supply terminals 202L, 203L and 205L, which provide power to the circuits in the non-beam area 52L from a power slab 201L connected to the non-beam area 52L, the power supply common 204 which forms a return circuit to the same power slab 201L. On the other hand, for the power supply terminals 202R, 203R and 205R, which provide power to the circuits in the non-beam area 52R from a power slab 201R connected to the non-beam area 52R, the power supply common 204 also forms a return circuit to the same power slab 201R. Thus, the beamlet deflectors in a beam area 51 are controlled by driving circuits located in the non-beam areas 52L, 52R on both sides of the beam area, where the driving circuits in one non-beam area are at least to some extent electrically isolated from the driving circuits in the other non-beam area (all power supplies 202,203,205 except for the power supply common 204). This isolation seeks to prevent current flow, for example, from power slab 201L, to light sensitive elements 40L and demultiplexers 40L in the non-beam area 52L, through the beam area 51, to the power supply common 204 to the adjacent power slab 201R. The circuit arrangement seeks to prevent current flow from one power slab to another power slab, as this may unbalance the current flows through a power slab so that the return current is not equal to the forward current in the power slab and the cancellation of the magnetic fields generated by the currents in the power slab is reduced.

Figure 9:
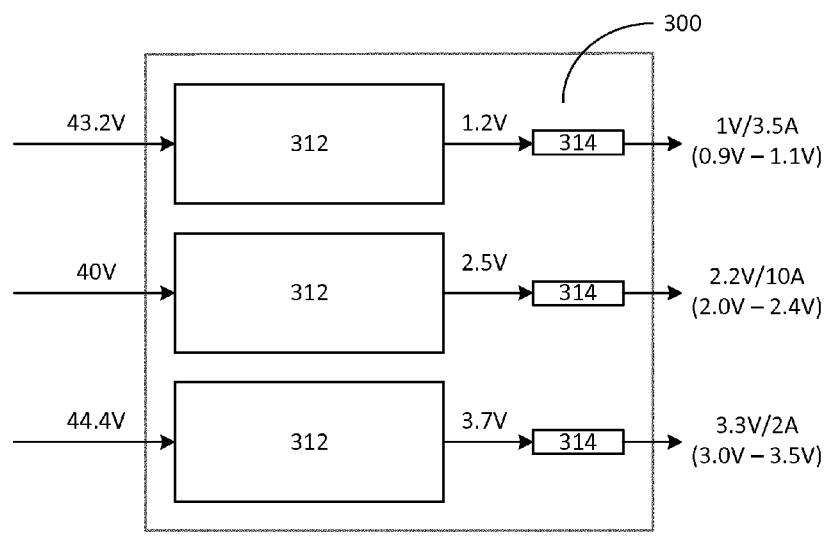
FIG. 9 shows the conceptual configuration of power modulation in a power unit of a beamlet blanker array.

FIG. 9 shows the simplified diagram of power modulation in the power unit 300 (power supply arrangement). Three separate DC power feeds (43.2V, 40V, 44.4V) are provided to DC to DC converters 312 and linear regulators 314 to generate the voltage supplies 1V, 2.2V, 3.3V respectively. Suitable DC-DC converters are e.g. Vicor VTM chips. By using three separate voltage feeds instead of a single supply feed, the dissipation in the circuits can be kept as small as possible.

Figure 10:
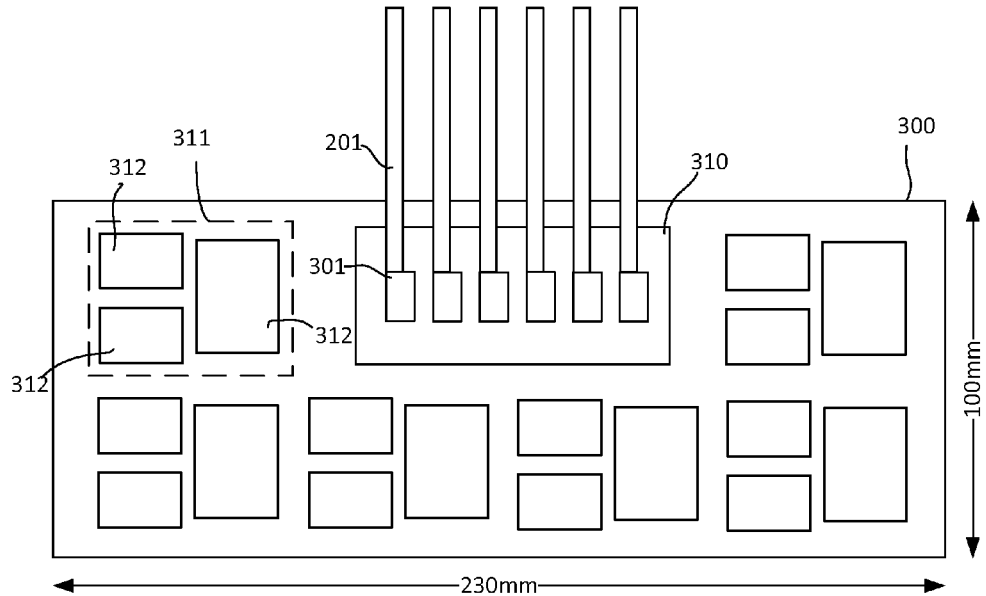
FIG. 10 shows a simplified schematic top view of a power unit of a beamlet blanker array.

FIG. 10 shows a simplified, schematic top view of the power unit 300. In this embodiment, six groups 311 of DC-DC converters 312 for provided for ten power slabs 201 for providing power to five beam areas located between each pair of power slabs. In the figure only 6 power slabs 201 have been drawn for simplicity reasons. The outer slabs 201 each represent a single power slab 201 and the inner power slabs 201 comprises a set of two power slabs which are put side by side. Electrically these power slab couples are connected together thus arriving at 6 groups 311, wherein for each group 311 a set of DC-DC converters 312 is provided. On the power unit 300 there is also an output area 310 where linear regulators 314 and power supply connectors 301 are located.

It must be emphasized that the invention resides in the conductive power slabs, which each are built up from a plurality of plates which are to be connected between the non-beam area of the modulation device and the circuitry of the power unit (part of the power supply arrangement). A designer has the option to integrate such plates in the modulation device or in the power supply arrangement. The invention covers both options. Expressed differently, the power supply arrangement and the modulation device constitute a plug-socket type of configuration.

The invention has been described by reference to certain embodiments discussed above. It will be recognized that these embodiments are susceptible to various modifications and alternative forms well known to those of skill in the art without departing from the spirit and scope of the invention. Accordingly, although specific embodiments have been described, these are examples only and are not limiting upon the scope of the invention, which is defined in the accompanying claims.

The invention claimed is:

1. A modulation device for use in a charged particle lithography system adapted to generate charged particle beamlets, the modulation device arranged for modulating the charged particle beamlets in accordance with pattern data and comprising:
a plate-like body;
an array of beamlet deflectors arranged on the plate-like body for deflecting the beamlets;
a plurality of power supply terminals for supplying at least two different voltages;
a plurality of control circuits arranged on the plate-like body to receive the pattern data and supply corresponding control signals to the beamlet deflectors, wherein the control circuits are fed by the plurality of power supply terminals; and
a conductive slab arranged to supply electrical power to one or more of the power supply terminals,
wherein the body of the modulation device is divided into an elongated beam area and an elongated non-beam area positioned adjacent to the beam area so that a long edge of the beam area borders a long edge of an adjacent non-beam area,
wherein the beamlet deflectors are arranged in the beam area,
wherein the control circuits are located in the non-beam area for providing control signals to the beamlet deflectors; and
wherein the conductive slab is connected to the one or more of the power supply terminals in the non-beam area, the conductive slab comprising a plurality of thin conductive plates.

2. A modulation as claimed in claim 1, comprising a plurality of conductive slabs arranged to supply electrical power to the power supply terminals;
wherein the body of the modulation device is divided into a plurality of elongated beam areas and a plurality of elongated non-beam areas positioned adjacent to the beam areas so that a long edge of each beam area borders a long edge of an adjacent non-beam area;
wherein the beamlet deflectors are arranged in groups, each group of beamlet deflectors located in one of the beam areas;
wherein the control circuits are located in the non-beam areas for providing control signals to the beamlet deflectors, each control circuit located in one of the non-beam areas adjacent to one of the beam areas containing one or more of the beamlet deflectors receiving control signals from the control circuit; and
wherein the conductive slabs are connected to the control circuits in the non-beam areas, each conductive slab comprising a plurality of thin conductive plates, wherein the plurality of conductive slabs forms part of the power supply arrangement.

3. The modulation device of claim 1, wherein each thin conductive plate is configured for connecting to a respective one of said power supply terminals.

4. The modulation device of claim 1, wherein each of the conductive plates of the conductive slab has a face terminating in one or more edges, and the plates are arranged with their faces substantially parallel to each other, wherein the face of each of the conductive plates of the conductive slab is substantially equal in area.

5. The modulation device of claim 1, wherein each conductive plate of the conductive slab has substantially the same resistivity relative to the other conductive plates of the conductive slab.

6. The modulation device of claim 1, wherein each conductive plate of the conductive slab has substantially the same resistivity at every position over its extent relative to the other conductive plates of the conductive slab.

7. The modulation device of claim 1, wherein at least one edge of each conductive plate is adapted for connection to a power supply and at least one different edge of each plate is adapted for connection to a plurality of the control circuits.

8. The modulation device of claim 1, wherein the control circuits are distributed along substantially all of the length of the long edge of a non-beam area which borders the long edge of an adjacent beam area.

9. The modulation device of claim 8, wherein connections between the conductive slab and the control circuits in a non-beam area are distributed along substantially all of the length of the long edge of a non-beam area which borders the long edge of an adjacent beam area.

10. The modulation device of claim 1, wherein connections between the conductive slab and the control circuits are made via a plurality of conductive bumps or solder joints on a surface of the body of the modulation device, wherein the conductive slab comprises a first portion with a face parallel to the surface of the body where the bumps are located, and a larger second portion substantially perpendicular to the surface of the body.

11. The modulation device of claim 10, wherein a first plurality of the conductive bumps or solder joints connect with a first one of the conductive plates of a conductive slab, and a second plurality of the conductive bumps connect with a second one of the conductive plates of the conductive slab.

12. The modulation device of claim 1, wherein the conductive slab comprises a plurality of conductive plates arranged to conduct forward electrical current from a power supply to the control circuits and beamlet deflectors, and at least one conductive plate arranged to conduct return electrical current from the control circuits and beamlet deflectors to the power supply, wherein the forward electrical current is substantially equal to the return electrical current.

13. The modulation device of claim 1, wherein the control circuits comprise a plurality of light sensitive elements arranged to receive modulated optical signals carrying the pattern data and converting the optical signals into electrical control signals for control of the beamlet deflectors, and wherein conductive lines from the conductive plates to the light sensitive elements and return lines are substantially perpendicular to the face of the conductive plates.

14. The modulation device of claim 1, wherein the beam areas have a length and a width, the length being at least five times the width.

15. The modulation device of claim 1, wherein the control circuits comprise a plurality of light sensitive elements arranged to receive modulated optical signals carrying the pattern data and converting the optical signals into electrical control signals for control of the beamlet deflectors.

16. The modulation device of claim 15, wherein the control circuits further comprise a plurality of demultiplexers, each demultiplexer arranged to receive a control signal from a corresponding one of the light sensitive elements, and demultiplex the control signal to generate a plurality of control signals to control a plurality of beamlet deflectors.

17. A charged particle lithography system comprising:
    a beam generator arranged for generating a plurality of charged particle beamlets divided into separate groups;
    a modulation device according to claim 1; and
    a projection system arranged for projecting the modulated beamlets onto a target to be exposed;
    wherein each beam area of the modulation device is positioned in the path of one of the groups of beamlets and each non-beam area is positioned outside the path of the beamlets.

18. A power supply arrangement for use in a charged particle lithography system comprising a modulation device arranged for modulating charged particle beamlets in accordance with pattern data and comprising:
    a plate-like body;
    an array of beamlet deflectors arranged on the plate-like body for deflecting the beamlets;
    a plurality of power supply terminals for supplying at least two different voltages; and
    a plurality of control circuits arranged on the plate-like body to receive the pattern data and supply corresponding control signals to the beamlet deflectors, wherein the control circuits are fed by the plurality of power supply terminals,
    the power supply arrangement comprising:
    at least one input terminal for receiving at least one input voltage;
    at least two output terminals for supplying at least two different output voltages;
    at least one DC-DC converter coupled between the at least one input terminal and the at least two output terminals, the at least one DC-DC converter being configured for converting the at least one input voltage into the at least two different output voltages, and
    a conductive slab coupled to said at least two output terminals, the conductive slab being configured for being coupled to the power supply terminals of the modulation device for supplying electrical power to the modulation device, the conductive slab comprising a plurality of thin conductive plates.

19. A modulation device for use in a charged particle lithography system adapted to generate a plurality of groups of charged particle beamlets, the modulation device arranged for modulating the charged particle beamlets in accordance with pattern data and comprising a plate-like body, an array of beamlet deflectors arranged for deflecting the beamlets, a plurality of control circuits arranged to receive the pattern data and supply corresponding control signals to the beamlet deflectors, and a plurality of conductive slabs arranged to supply electrical power to the control circuits and beamlet deflectors;
    wherein the body of the modulation device is divided into a plurality of elongated beam areas and a plurality of elongated non-beam areas positioned adjacent to the beam areas so that a long edge of each beam area borders a long edge of an adjacent non-beam area;
    wherein the beamlet deflectors are arranged in groups, each group of beamlet deflectors located in one of the beam areas;
    wherein the control circuits are located in the non-beam areas, each control circuit located in one of the non-beam areas adjacent to one of the beam areas containing one or more of the beamlet deflectors receiving control signals from the control circuit; and
    wherein the conductive slabs are connected to the control circuits in the non-beam areas, each conductive slab comprising a plurality of thin conductive plates.

20. The modulation device of claim 19, further comprising a plurality of conductive slabs arranged to supply electrical power to the power supply terminals, each conductive slab comprising a plurality of thin conductive plates, wherein each thin conductive plate is configured for connecting to a respective one of said power supply terminals.

* * * * *